United States Patent [19]
Husain

[11] Patent Number: 5,880,922
[45] Date of Patent: *Mar. 9, 1999

[54] MULTILAYERED ELECTROSTATIC CHUCK AND METHOD OF MANUFACTURE THEREOF

[75] Inventor: Anwar Husain, Pleasanton, Calif.

[73] Assignee: Lam Research Corporation, Fremont, Calif.

[*] Notice: The term of this patent shall not extend beyond the expiration date of Pat. No. 5,671,116.

[21] Appl. No.: 839,315

[22] Filed: Apr. 17, 1997

Related U.S. Application Data

[63] Continuation of Ser. No. 401,524, Mar. 10, 1995, Pat. No. 5,671,116.

[51] Int. Cl.$^6$ ..................................................... H03N 13/00
[52] U.S. Cl. ........................... 361/234; 361/235; 279/128
[58] Field of Search .................................. 361/234, 233, 361/235; 279/128

[56] References Cited

U.S. PATENT DOCUMENTS

| | | |
|---|---|---|
| 3,518,756 | 7/1970 | Bennett et al. . |
| 3,838,204 | 9/1974 | Ahn et al. . |
| 3,993,509 | 11/1976 | McGinty . |
| 4,080,414 | 3/1978 | Anderson et al. . |
| 4,184,188 | 1/1980 | Briglia . |
| 4,234,367 | 11/1980 | Herron et al. . |
| 4,384,918 | 5/1983 | Abe . |
| 4,430,365 | 2/1984 | Schaible et al. . |
| 4,431,473 | 2/1984 | Okano et al. . |
| 4,464,223 | 8/1984 | Gorin . |
| 4,502,094 | 2/1985 | Lewin et al. . |
| 4,554,611 | 11/1985 | Lewin . |
| 4,579,618 | 4/1986 | Celestino et al. . |
| 4,645,218 | 2/1987 | Ooshio et al. . |
| 4,665,463 | 5/1987 | Ward et al. . |
| 4,677,254 | 6/1987 | Boss et al. . |
| 4,692,836 | 9/1987 | Suzuki . |
| 4,724,510 | 2/1988 | Wicker et al. . |
| 4,799,983 | 1/1989 | Desai . |
| 4,842,683 | 6/1989 | Cheng et al. . |
| 4,897,171 | 1/1990 | Ohmi . |
| 4,962,441 | 10/1990 | Collins . |
| 4,983,254 | 1/1991 | Fujimura et al. . |
| 5,004,640 | 4/1991 | Nakatani et al. . |
| 5,055,964 | 10/1991 | Logan et al. . |
| 5,103,367 | 4/1992 | Horwitz et al. . |
| 5,104,834 | 4/1992 | Watanabe et al. . |
| 5,110,438 | 5/1992 | Ohmi et al. . |
| 5,117,121 | 5/1992 | Watanabe et al. . |

(List continued on next page.)

FOREIGN PATENT DOCUMENTS

| | | |
|---|---|---|
| 0498752 A1 | 8/1992 | European Pat. Off. . |
| 0506537 A1 | 8/1992 | European Pat. Off. . |
| 0512936 A1 | 9/1992 | European Pat. Off. . |
| 62-157752 | 7/1987 | Japan . |
| 1-251735 | 10/1989 | Japan . |
| 3-3249 | 1/1991 | Japan . |
| 3-147843 | 6/1991 | Japan . |
| 3-147844 | 6/1991 | Japan . |
| 1443215 | 7/1976 | United Kingdom . |

*Primary Examiner*—Fritz Fleming
*Attorney, Agent, or Firm*—Burns, Doane, Swecker & Mathis, L.L.P.

[57] ABSTRACT

A ceramic electrostatic chucking device having electrostatic clamping electrodes suitable for clamping wafers and flat panel displays. The chucking device includes a top insulating layer, the clamping electrode, a second insulating layer, a first metallization layer for distributing power to one of the clamping electrodes, a third insulating layer, a second metallization layer for distributing power to the other clamping electrode, a fourth insulation layer, inner and outer heater electrodes, a fifth insulating layer, a third metallization layer for distributing power to the heater electrodes, and at least one additional insulating layer. The insulating layers include groups of electrically conductive feedthroughs for interconnecting the electrodes and metallization layers.

30 Claims, 6 Drawing Sheets

U.S. PATENT DOCUMENTS

| | | |
|---|---|---|
| 5,151,845 | 9/1992 | Watanabe et al. . |
| 5,155,652 | 10/1992 | Logan et al. . |
| 5,160,152 | 11/1992 | Toraguchi et al. . |
| 5,179,498 | 1/1993 | Hongoh et al. . |
| 5,191,506 | 3/1993 | Logan et al. . |
| 5,207,437 | 5/1993 | Barnes et al. . |
| 5,326,725 | 7/1994 | Sherstinsky et al. . |
| 5,331,134 | 7/1994 | Kimura . |
| 5,350,479 | 9/1994 | Collins et al. . |
| 5,436,790 | 7/1995 | Blake et al. . |
| 5,463,525 | 10/1995 | Barnes et al. . |
| 5,671,116 | 9/1997 | Husain ................................. 361/234 |

MULTILAYERED ELECTROSTATIC CHUCK AND METHOD OF MANUFACTURE THEREOF

This application is a continuation of application No. 08/401,524, filed Mar. 10, 1995, now U.S. Pat. No. 5,671,116.

FIELD OF THE INVENTION

The invention relates to an electrostatic chucking device useful in the manufacture of semiconductor devices and flat panel displays.

Background of the Invention

Various types of electrostatic chucking devices for clamping substrates such as semiconductor wafers are disclosed in U.S. Pat. Nos. 3,993,509; 4,184,188; 4,384,918; 4,431,473; 4,554,611; 4,502,094; 4,645,218; 4,665,463; 4,692,836; 4,724,510; 4,842,683; 4,897,171; 4,962,441; 5,055,964; 5,103,367; 5,110,438; 5,117,121; 5,160,152; 5,179,498; 5,326,725; and 5,350,479 and British Patent No. 1,443,215.

Multilayer electrostatic chucking devices which utilize ceramic materials are disclosed in U.S. Pat. Nos. 5,151,845 and 5,191,506. The '845 patent discloses an arrangement including a base plate of alumina, silicon nitride, aluminum nitride, silicon carbide or the like, and first and second layers of titanium doped alumina having a silver/palladium electrode film pattern printed on lower surfaces thereof, the electrodes being individually and selectively supplied with a voltage to electrostatically attract a wafer. The '506 patent discloses an arrangement including a top 0.05 mm thick ceramic layer, an electrically conductive electrostatic pattern of 0.75 mm wide strips separated by 0.25 mm gaps on a ceramic layer, a ceramic support layer and a water cooled metal heat sink base of Kovar (29Ni/17Co/53Fe).

Electrostatic chucking devices have been used for wafer transport and support during processing such as deposition, etching, ashing, etc. For instance, such chucking devices have been used to hold wafers in plasma reaction chambers. However, depending on the type of process carried out on the wafer, the chucking device may be subjected to the corrosive effects of the plasma and/or temperature cycles which may deleteriously affect the chucking devices.

Substrate holders incorporating a heater are known in the art. For instance, U.S. Pat. No. 4,983,254 discloses a wafer supporting stage which includes a heater. The '254 patent does not disclose any arrangement for electrostatically clamping the wafer.

It is known in the art to provide electrodes which are supplied radio frequency at different frequencies and electrodes which are connected to direct current and RF sources. For instance, U.S. Pat. No. 4,579,618 discloses a bottom electrode which serves as a workpiece holder and which is connected to a low frequency power supply and a high frequency power supply, both of which are coupled to the electrode through coupling networks which are intended to optimize RF transmission through impedance matching. U.S. Pat. No. 4,464,223 discloses a bottom electrode for supporting a workpiece and is connected to a low frequency AC power supply through a matching network for creation of a low frequency electric field in a plasma chamber and the lower electrode is also coupled to a DC supply for allowing the amount of DC biasing induced by the plasma to be changed, independently of pressure or power.

SUMMARY OF THE INVENTION

The invention provides a multilayered electrostatic chucking device, comprising a first insulating layer of an electrically insulating ceramic material, a second insulating layer of an electrically insulating ceramic material, and an electrostatic clamping electrode between the first and second insulating layers. The clamping electrode includes first and second strips of electrically conductive material. The chucking device also includes a third insulating layer of electrically insulating ceramic material and a heater electrode between the second and third insulating layers.

According to one aspect of the invention, the first strip can be electrically connected to a first direct current power supply and the second strip can be electrically connected to a second direct current power supply wherein the first and second direct current power supplies are at opposite polarities. In addition, the clamping electrode can be electrically connected to a radio frequency energy supply. The direct current power supplies the clamping electrode with energy sufficient to electrostatically clamp a substrate on the first insulating layer and the radio frequency energy supply provides the clamping electrode with energy sufficient to provide a substrate clamped on the first insulating layer with an RF bias during plasma assisted deposition.

According to another aspect of the invention, the heater electrode can comprise one or more spirally extending strips of electrically conductive material. For instance, the heater electrode can comprise an inner heater electrode and an outer heater electrode surrounding the inner heater electrode. The chucking device can include a heat sink base, the third insulating layer being located between the heat sink base and the heater electrode.

The chucking device can include additional layers of ceramic material such as a fourth insulating layer of electrically insulating ceramic material and a metallization layer on the fourth insulating layer. The metallization layer can include a plurality of radially extending legs electrically connected to the clamping electrode. Electrical power can be supplied to the clamping electrode strips through a plurality of groups of electrically conductive feedthroughs in the second insulating layer. A first group of the feedthroughs can be electrically connected to the first strip and a second group of the feedthroughs can be electrically connected to the second strip. The chucking device can also include openings extending axially through the first, second and third insulating layers and at least some of the openings can be large enough to allow lifting pins to pass through the chucking device.

The invention also provides an electrostatic chucking device including a first insulating layer of an electrically insulating ceramic material, a second insulating layer of electrically insulating ceramic material, an electrostatic clamping electrode between the first and second insulating layers wherein the clamping electrode includes first and second strips of electrically conductive material, a first group of electrically conductive feedthroughs extending through the second insulating layer and in electrical contact with the first strip, and a second group of electrically conductive feedthroughs extending through the second insulating layer and in electrical contact with the second strip.

The invention provides a method of making a ceramic electrostatic chuck comprising steps of (a) providing a first metallization layer on a top side of a first insulating layer, the first insulating layer comprising electrically insulating ceramic material in a green state having first and second groups of electrically conductive feedthroughs extending therethrough, the metallization layer comprising an electrostatic clamping electrode pattern of first and second strips of electrically conductive material, (b) providing a second metallization layer on a top side of a second insulating layer, the second insulating layer comprising electrically insulating ceramic material in a green state having third groups of electrically conductive feedthroughs extending therethrough, the second metallization layer comprising a power distributing electrode pattern of electrically conductive material, (c) assembling the second insulating layer on a bottom side of the first insulating layer, (d) and cofiring the first and second insulating layers and forming a sintered body with the first and third groups of feedthroughs in electrical contact with the first strip and the second group of feedthroughs in electrical contact with the second strip.

The method can further comprise steps of providing a third metallization layer on a top side of a third insulating layer, the third insulating layer comprising electrically insulating ceramic material in a green state, the third metallazation layer comprising a power distribution electrode pattern of electrically conductive material, and assembling the third insulating layer on a bottom side of the second insulating layer prior to the cofiring step. The method can include providing a fourth metallization layer on a top side of a fourth insulating layer, the fourth insulating layer comprising electrically insulating ceramic material in a green state, the fourth metallization layer comprising a heater electrode pattern of electrically conductive material, and assembling the fourth insulating layer on a bottom side of the third insulating layer prior to the cofiring step. The heater electrode can comprise one or more spirally extending strips of electrically conductive material. For instance, the heater electrode can include an inner heater electrode and an outer heater electrode surrounding the inner heater electrode. The method can include steps of attaching a heat sink base to the sintered body and assembling a top insulating layer on the top of the first insulating layer of electrically insulating material in a green state prior to or subsequent to the cofiring step.

The invention also provides a method of manufacturing a ceramic electrostatic chuck comprising steps of (a) providing a first insulating layer comprising electrically insulating ceramic material in a green state and having first and second groups of electrically conductive feedthroughs extending therethrough, (b) providing a first metallization layer on a top side of a second insulating layer, the second insulating layer comprising electrically insulating ceramic material in a green state having third groups of electrically conductive feedthroughs extending therethrough and the first metallization layer comprising a power distributing electrode pattern of electrically conductive material, (c) assembling the second insulating layer on a bottom side of the first insulating layer, and (d) cofiring the first and second insulating layers and forming a sintered body with the first and third groups of feedthroughs in electrical contact with each other.

The method can further comprise providing a second metallization layer on a top side of a third insulating layer wherein the third insulating layer comprises electrically insulating ceramic material in a green state and the third metallization layer comprises a power distribution electrode pattern of electrically conductive material, and assembling the third insulating layer on a bottom side of the second insulating layer prior to the cofiring step. In addition, an electrostatic clamping electrode pattern of first and second strips of electrically conductive material can be provided on the top side of the first insulating layer such that the first and second groups of feedthroughs are in electrical contact with the first strip and the second group of feedthroughs are in electrical contact with the second strip. A top insulating layer of electrically insulating ceramic material can be provided over the clamping electrode and an exposed surface of the top insulating layer can be ground and/or polished to provide a predetermined distance between a top of the clamping electrode and the exposed surface of the top insulating layer. The ceramic material of the top insulating layer can be in a green state and the step of providing the top insulating layer can be performed prior to or after the cofiring step.

DETAILED DESCRIPTION OF THE PREFERRED EMBODIMENTS

Figure 1:
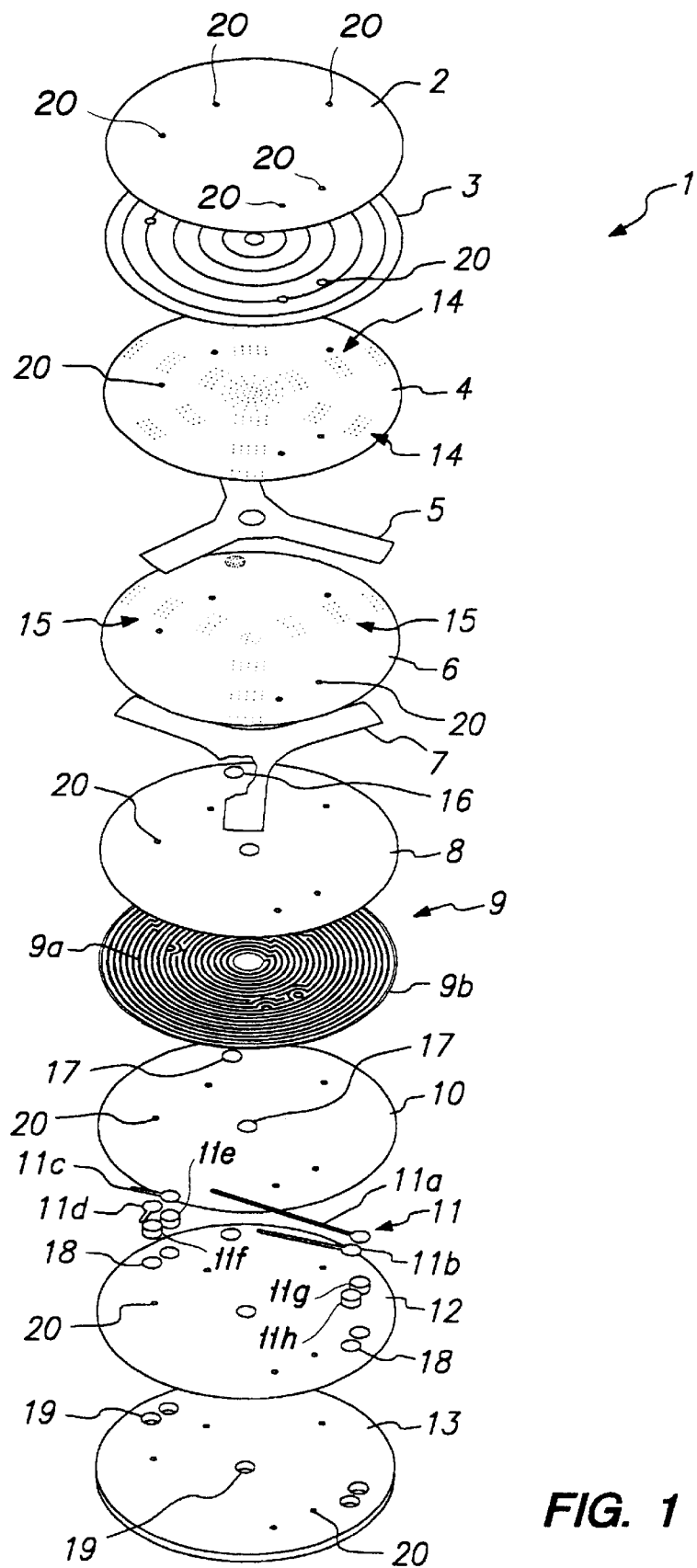
FIG. 1 shows an exploded view of a chuck in accordance with the invention.

The invention provides a multilayered electrostatic chucking and/or transporting device which offers advantages over existing chucking devices in terms of performance, cost and/or ease of construction thereof.

The electrostatic chuck according to the invention can be used for transporting, holding and/or temperature control of a semiconductor wafer or gas substrate (i.e., flat panelled display) during processing, for example, in a CVD, PVD or etch reactor. The chuck can be used to hold the wafer/flat panel display substrate during processing and/or during transport thereof. The chuck can optionally include the capability of applying high RF bias voltage to the substrate during plasma assisted deposition. According to a preferred embodiment of the invention, the chuck incorporates ceramic materials such as alumina, aluminum nitride, etc. Further, the chuck can incorporate heaters embedded therein whereby a wafer can be preheated to a constant temperature and maintained at such constant temperature during processing thereof.

According to one aspect of the invention, cofired alumina tape layers with refractory metallization (metals such as tungsten, etc.) are incorporated in the chuck. This technique allows advantages such as considerable latitude in designing the chuck with respect to provision of multiple metal layers embedded in the ceramic layers. For instance, the chuck can include electrodes for clamping and RF with or without additional heaters embedded in the ceramic material. The chuck according to the invention allows an RF bias as high as 10 watts/cm$^2$ to be achieved. Moreover, due to the use of ceramic layers, the porosity associated with techniques such as anodization and flame spray techniques can be avoided. Such porosity is deleterious since the presence of the porosity results in a higher voltage being needed for clamping.

The chuck according to the invention can be used to process silicon wafers during processes such as etching, CVD, PVD, etc. With the chuck according to the invention, clamping pressures of 30 Torr can be achieved with an applied voltage of 1500 volts. In addition, such clamping forces can be achieved with less than 1 sccm helium leakage between the chuck and the underside of the wafer. Further, with the chuck according to the invention, the upper dielectric layer can be thick allowing a groove design for the helium heat transfer medium between the wafer and the chuck and the surface finish to be optimized depending on the particular process carried out in the reaction chamber in which the chuck is used.

The chuck according to the invention is particularly useful in clamping flat panel displays. Such displays are typically of glass. The chuck can clamp such glass substrates with a clamping pressure of 5 Torr and an applied voltage of 2000 volts.

The chuck according to the invention utilizes multilayers of ceramic materials wherein metallization can be provided between adjacent ceramic layers. With this arrangement heater electrodes can be provided between one set of ceramic layers and the clamping electrodes can be provided between a different set of ceramic layers. Further, since the chuck is of ceramic materials, the chuck can be exposed to an oxidizing plasma without damage thereto. In cases where the chuck is used in a reaction chamber in which deposition is carried out, the deposition by-products can be chemically cleaned off the chuck without damage thereto.

The chuck according to the invention can incorporate one or more heater electrodes between adjacent ceramic layers or disposed between different sets of ceramic layers. In the case where the chuck is used in a reaction chamber in which deposition is carried out, the heaters can be individually supplied with electrical power to provide for different heating effects. For instance, if one heater is located in the central area of the chuck and the other heater is located in the periphery of the chuck, it is possible to power the heaters in a manner which compensates for plasma non-uniformity and/or edge effects. The heaters can also be used to provide temperature control during wafer transport such as in a metal etch application.

The chuck can be manufactured in various ways. For instance, all of the ceramic layers with refractory metal clamping electrodes/RF electrodes/heater electrodes can be sintered together simultaneously. Alternatively, the chuck can be manufactured in steps wherein various ceramic layers with or without the clamping/RF electrode/heater electrode metal layers can be sintered to form part of the final chuck. For instance, all of the ceramic layers with or without the RF electrodes/heater electrodes can be sintered to form a chuck which does not include the electrostatic clamping electrode layer. The clamping electrode can be applied after grinding the assembly to make it flat. Then, after the electrodes are applied, a top dielectric layer such as doped alumina, pure alumina, single crystal sapphire, etc., can be applied over the clamping electrodes. The ceramic chuck can be supported on a heat sink base. For instance, the base can be a non-magnetic material such as aluminum oxide, stainless steel, molybdenum, aluminum nitride, etc.

FIG. 1 shows an exploded view of a chuck 1 in accordance with one embodiment of the invention. The chuck includes a top insulating layer 2, a metallization layer 3 including first and second interdigitating clamping electrodes, an insulating layer 4, a metallization layer 5 for distributing power to one of the clamping electrodes, an insulating layer 6, a metallization layer 7 for distributing power to the other clamping electrode, an insulating layer 8, a metallization layer 9 including inner and outer heater electrodes, an insulating layer 10, a metallization layer 11 for distributing power to the heater electrodes, an insulating layer 12 and an insulating layer 13. In addition, feedthroughs 14 are provided in insulating layer 4, feedthroughs 15 are provided in insulating layer 6, feedthroughs 16 are provided in insulating layer 8, feedthroughs 17 are provided in insulating layer 10, feedthroughs 18 are provided in insulating layer 12 and feedthroughs 19 are provided in insulating layer 13. One or more holes 20 can be provided through the entire assembly to allow lift pins and/or temperature probes and/or a heat transfer fluid such as helium to contact the underside of a substrate supported on the insulating layer 2.

Metallization layer 11 distributes electrical power to inner heater electrode 9*a* and outer heater electrode 9*b*. In particular, the wide ends of conductor paths 11*a*, 11*b*, 11*c* and 11*d* are electrically connected to conductors 11*e*, 11*f*, 11*g* and 11*h*, respectively. Conductors 11*e*, 11*f*, 11*g* and 11*h* fill four of the feedthrough holes 18 and 19. The thin ends of conductor paths 11*a* and 11*b*, respectively, are connected to inner and outer portions of a coil forming inner heater electrode 9*a* and the thin ends of conductor paths 11*c* and 11*d*, respectively, are connected to inner and outer portions of a coil forming outer heater electrode 9*b*.

Figure 2:
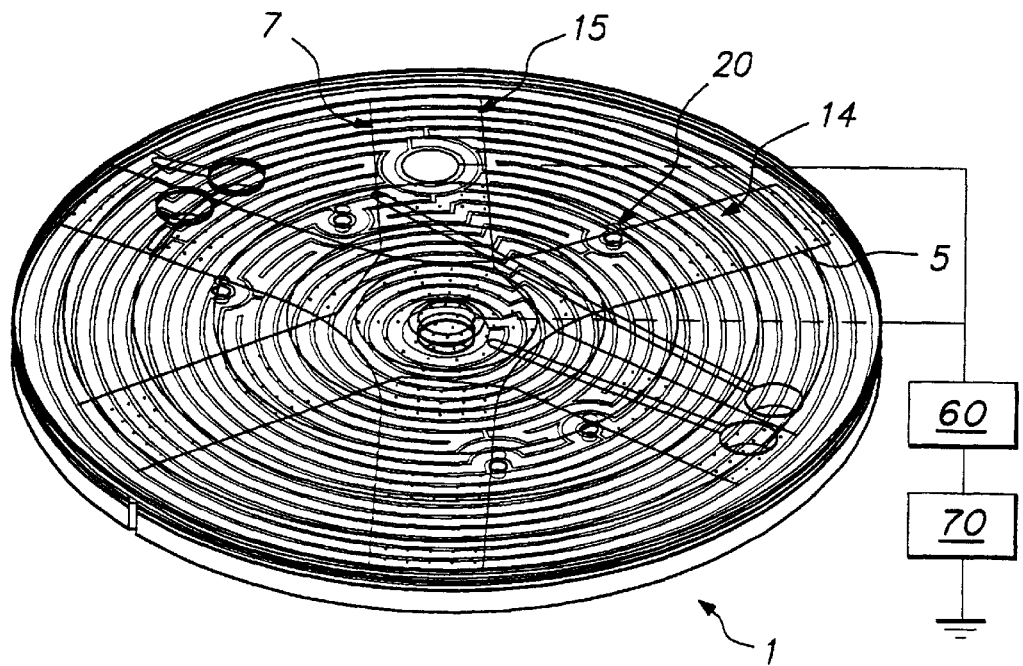
FIG. 2 shows an assembly of the layers shown in FIG. 1.

FIG. 2 is a cross-section of the chuck 1 of FIG. 1 in the assembled condition. As shown in FIG. 2, the radially extending legs of metallization layers 5, 7 are offset such that the legs are spaced 60 degrees apart. Further, the chuck 1 includes five openings 20, three of which are spaced 120 degrees apart and are used for passage of lifting pins and supplying helium to the backside of the wafer and the other two openings receive temperature probes.

Figure 3:
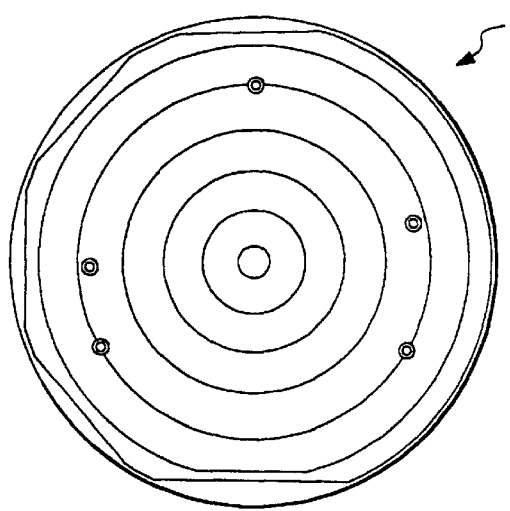
FIG. 3 shows a top view of another chuck in accordance with the invention.
Figure 4:
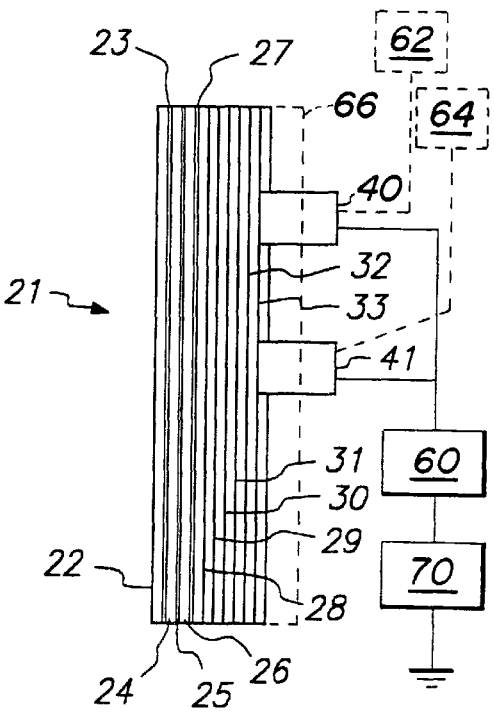
FIG. 4 shows a side view of the chuck shown in FIG. 3.

FIGS. 3–10 show another embodiment of a chuck in accordance with the invention. In particular, FIG. 3 shows a top view of chuck 21 and FIG. 4 shows a side view of the chuck shown in FIG. 3. As shown in FIG. 4, chuck 21 includes top insulating layer 22, metallization layer 23 including interdigitating first and second electrodes for applying an electrostatic clamping force to the wafer and supplying an RF bias to a plasma gas used to process a substrate mounted on the to insulating layer 22. Insulating layer 24 separates metallization layer 25 from insulation layer 26 and metallization layer 27 is between insulating layer 26 and insulating layer 28. The chuck also includes of insulating layers 29–33. Metallization layer 25 supplies electrical power to one of the electrodes comprising metallization layer 23. Metallization layer 27 supplies electrical power to the other electrode comprising metallization layer 23. Details of layers 24–29 are provided in FIGS. 5–9.

Figure 5:
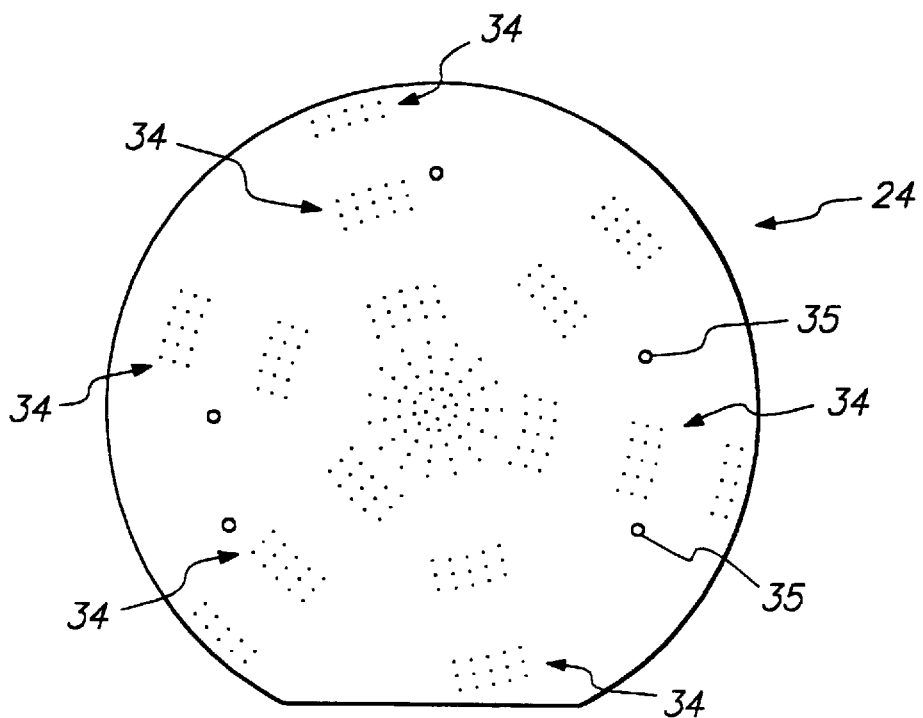
FIGS. 5–10 show details of layers of the chuck shown in FIGS. 3–4.

FIG. 5 shows details of insulating layer 24. In particular, insulating layer 24 includes electrical feedthrough openings 34 which are filled with a conductive material for supplying electrical energy to one of the electrodes comprising metallization layer 23. Five openings 35 are provided for passage of lift pins and/or temperature probes and/or passage of a cooling medium such as helium to the underside of a substrate supported on insulating layer 22. The electrical feedthroughs 34 are arranged in discrete groups of holes. For instance, if the clamping electrodes comprise strips which have a width of about 10 mm and are separated by gaps such as about 0.5 mm, the electrical feedthroughs 34 can comprise holes about 0.02 inch in diameter and these holes can be separated from each other by a distance such as about 4 mm. Thus, five holes can lie on a first segment of a circle, five holes can lie on a second segment of a circle of larger diameter and five holes can lie on a segment of a still larger circle, each of the circles being separated radially by about 4 mm and each of the holes on each segment of the circles being separated by about 4 mm. Further, the groups of holes can be arranged such that three discrete groups of holes are circumferentially spaced apart in radially extending patterns which are spaced 120 degrees apart. The use of a large number of holes allows the power requirements of the electrodes to be met. That is, when only a few holes are used, the conductive material in the holes act as resistors and cause the chuck to heat up. On the other hand, by providing a large number of holes as electrical feedthroughs, it is possible to supply a high power density to the electrodes while minimizing heat-up of the chuck.

Figure 6:
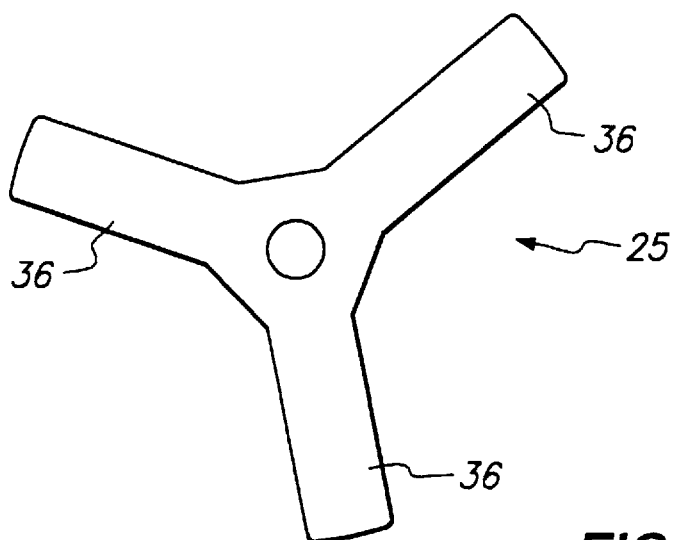

FIG. 6 shows details of the metallization layer 25. In particular, metallization layer 25 includes three radially extending legs 36 which are spaced apart by 120 degrees. The metallization layer 25 is in electrical contact with the conductive material filled in electrical feedthroughs 34. Thus, metallization layer 25 distributes electrical power to one of the electrodes comprising metallization layer 23.

Figure 7:
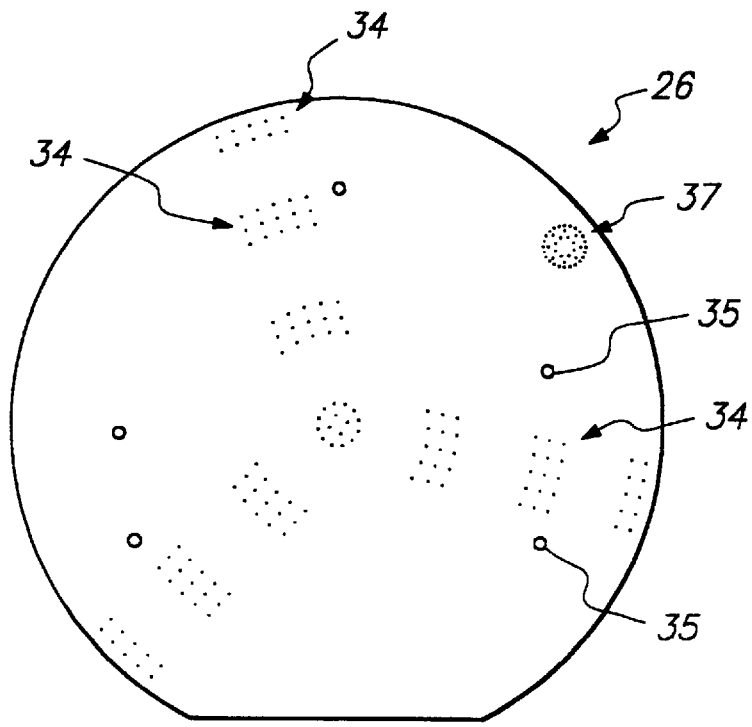

FIG. 7 shows details of insulating layer 26. Insulating layer 26 includes electrical feedthroughs 34 and openings 35 as described in connection with FIG. 5. In addition, insulating layer 26 includes electrical feedthroughs 37 for supplying electrical power to metallization layer 25.

Figure 8:
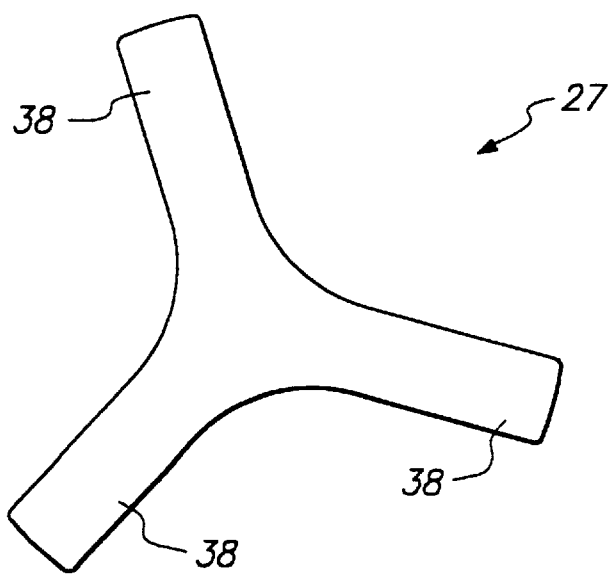

FIG. 8 shows details of metallization layer 27. Metallization layer 27 includes three radially extending legs 38 spaced apart by 120 degrees. Metallization layer 27 differs from metallization layer 25 in that metallization layer 27 does not include a central aperture therein. The central aperture in metallization layer 25 allows electrical feedthroughs 34 to connect metallization layer 27 to an electrode located at a central part of metallization layer 23.

Figure 9:
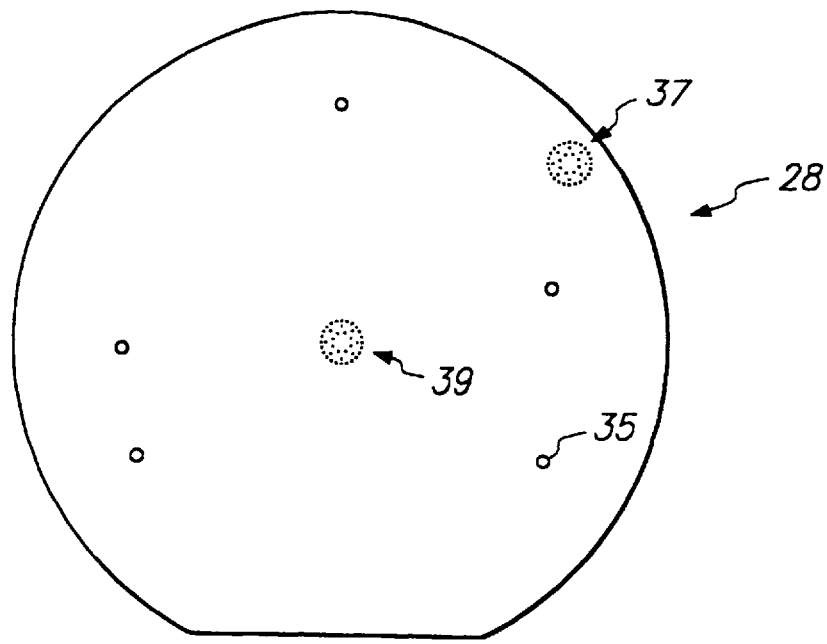

FIG. 9 shows details of insulating layer 28. Insulating layer 28 includes electrical feedthroughs 37 for supplying power to metallization 25 and openings 35 for passage of lifting pins and/or temperature probes and/or helium gas. In addition, insulating layer 28 includes electrical feedthroughs 39 for supplying electrical power to metallization layer 27. Insulating layers 29–32 are identical to insulating layer 28.

Figure 10:
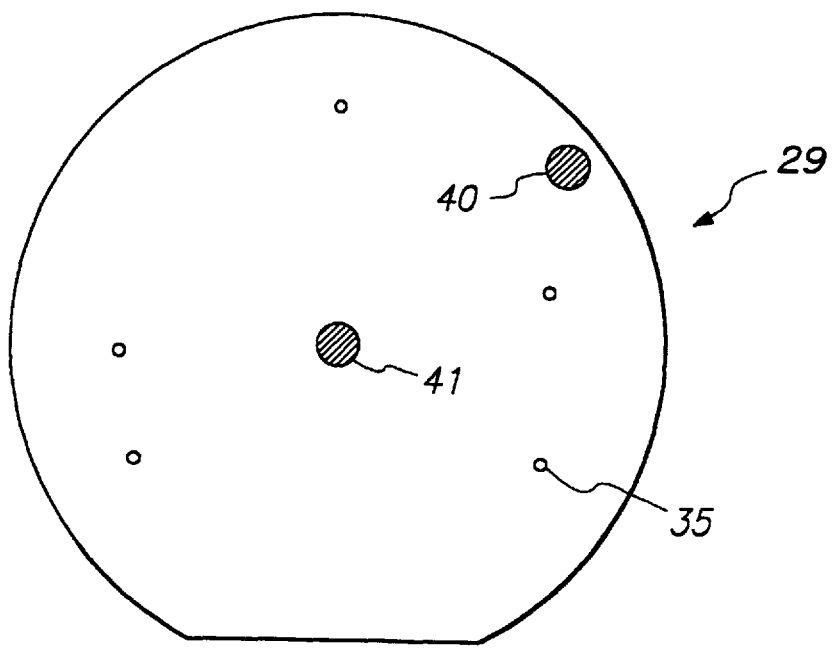

FIG. 10 shows details of insulating layer 29. In particular, insulating layer 29 includes openings 35 and electrical conductors 40, 41 for supplying power to the electrical feedthroughs 37, 29, respectively. Individual power supplies 62, 64 can be used to supply power to the inner and outer heaters via conductors 40, 41. Further, the ceramic chuck can be supported on a heat sink base 66.

The electrostatic chucking electrode, 3, 23 can be used to supply an RF bias to a substrate during plasma assisted deposition. In such cases, the clamping electrode can be supplied a direct current voltage from DC power supply 60 sufficient to clamp the substrate to the chuck and radiofrequency energy from RF power supply 70 sufficient to provide the substrate with an RF bias. The power supplies and associated circuitry to accomplish these objectives will be apparent to persons skilled in the art. For instance, U.S. Pat. No. 4,464,223, the subject matter of which is hereby incorporated by reference discloses details of power supplies and circuitry to supply DC and RF power to an electrode for supporting a workpiece.

The ceramic chuck according to the invention can be manufactured by cofiring the various ceramic and metallization layers or cofiring only part of the total ceramic chuck. For instance, the top insulating layer 22 and/or metalliaztion layer 23 can be applied after the remainder of the chuck has been fired to provide a sintered body. The top layer 22 can comprise a suitable insulating material such as aluminum oxide or aluminum nitride. The material of top layer 22 can be provided in powder form as a green sheet having any suitable thickness such as 0.028 inch. After the top layer has been fired, the top layer 22 can be ground down to a suitable thickness for purposes of adjusting the electrostatic clamping force. For example, the top layer can be ground down to provide a thickness of 0.008 inch.

The metallization layers can be provided on ceramic green sheets by any suitable process. For instance, electrically conductive paste such as tungsten can be silk screened in desired patterns on alumina sheets. Alternatively, the metallization layer can be deposited and subsequently etched to provide the desired pattern of clamping electrodes. In the case of metallization layer 23, the pattern can comprise alternating rings having a height perpendicular to the plane of the alumina sheet of 0.0008 inch, a width parallel to the plane of the alumina sheet of about 10 mm and the rings can be separated by gaps of about 0.5 mm.

The electrical feedthrough holes 34 in the insulating layers 24, 26 and 28 can have any suitable diameter and be spaced by any suitable distance. For instance, the holes can have diameters of 0.02 inch and can be spaced apart by about 4 mm. The number of holes can be adjusted to meet the power density requirements of the electrodes while preventing undesirable heat up of the chuck due to resistance heating of the electrically conductive material provided in the feedthroughs.

The metallization layers 25, 27 can be applied by silk screening of a suitable conductive material such as tungsten on alumina sheets. The metalliaztion layers 25, 27 can have a propeller-like shape with the width of the legs in a direction parallel to the plane of the alumina sheets of about 20 mm and a thickness in a direction perpendicular to the alumina sheets of about 0.0008 inch.

As shown in FIGS. 1 and 2, the chuck 1 can include heater electrodes. For instance, metallization layer 9 can include two groups of spiral rings with minor detours around power feeds and the holes for the lift pins/temperature probes. The heater electrodes can be used to compensate for non-uniform heat distribution during processing of a wafer clamped on the chuck 1. For instance, one of the heaters can comprise an inner group of rings which account for about 66% of the diameter of layer 9. The other heater can comprise an outer group of rings which account for the outer 33% of the diameter of layer 9. The heaters are supplied electrical power by separate power supplies to allow individual control of the heaters. For instance, the heaters can be supplied electrical power by metllization layer 11 wherein metallization layer includes four interconnects, two of which are connected to the inner heater and two of which are connected to the outer heater. The metalliazation layer 11 can be silk screened on an alumina sheet in the same manner that the other metallization layers are applied.

In order to maintain flatness of the chuck during operation thereof (e.g., avoid bowing during heating and cooling of the chuck), layers 2–13 can be repeated to provide a mirror image of the arrangement shown in FIG. 1. That is, layers 2–13 would comprise one-half of the ceramic chuck and another set of layers 2–13 would extend from layer 13 in reverse order such that insulating layer 2 would lie at the top and the bottom of the chuck. Alternatively, any desired number of metallization layers could be provided on only one side of the chuck.

Figure 11:
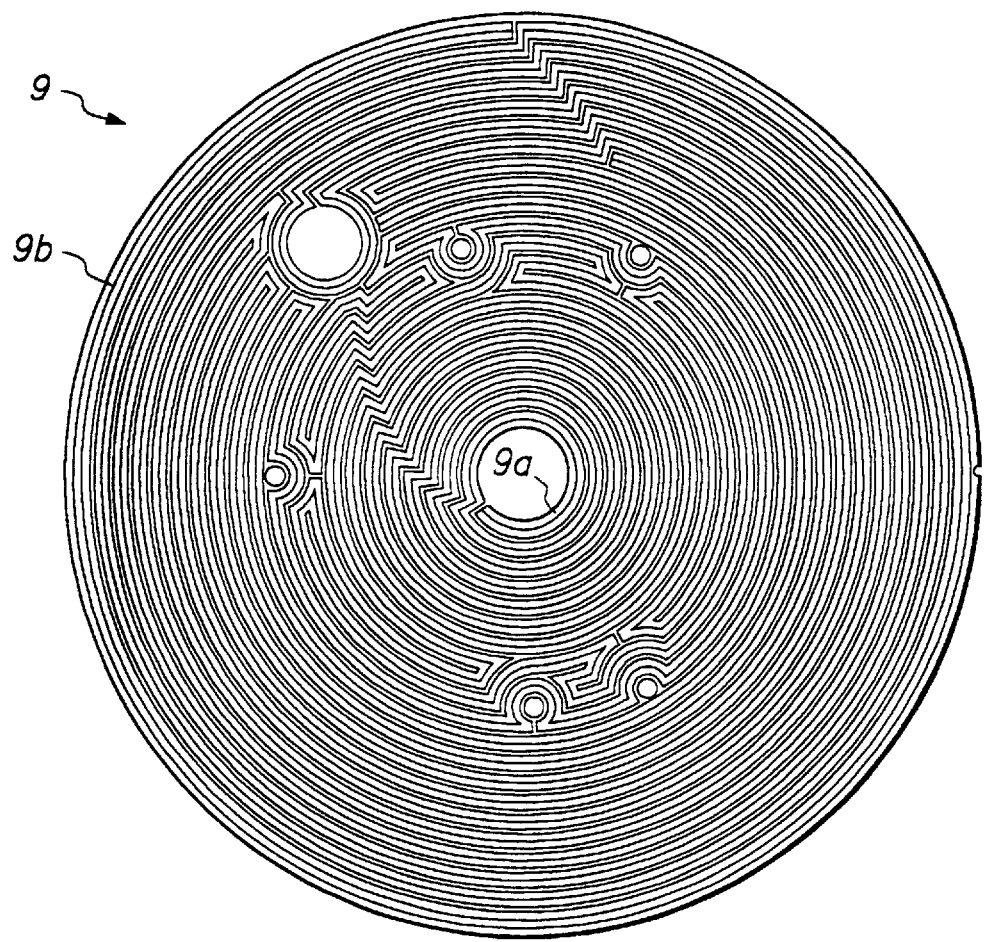
FIG. 11 shows a suitable electrode pattern for a heater electrode in accordance with the invention.

Details of a suitable heater electrode pattern are shown in FIG. 11 wherein heater electrode 9 includes inner heater electrode 9a and outer heater electrode 9b. As the heater 9 is primarily used to heat a wafer to a desired temperature prior to performing a deposition treatment thereon, the heater can be omitted in chucking devices according to the invention wherein the chuck is used solely for transporting a substrate (e.g., wherein the chuck 1, 21 is mounted on a suitable transporting mechanism such as a vertically movable pedestal, articulated robotic arm, or the like) or when the chuck is used in an etching environment.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A multilayered electrostatic chucking device, comprising:

a first insulating layer of an electrically insulating ceramic material;

a second insulating layer of an electrically insulating ceramic material;

an electrostatic clamping electrode between the first and second insulating layers, the clamping electrode including first and second strips of electrically conductive material;

a third insulating layer of electrically insulating ceramic material;

a heater electrode between the second and third insulating layers;

the clamping electrode being electrically connected to a direct current power supply and a radio frequency energy supply, the direct current power supply providing the clamping electrode with energy sufficient to electrostatically clamp a substrate on the first insulating layer and the radio frequency energy supply providing the clamping electrode with energy sufficient to provide a substrate clamped on the first insulating layer with an RF bias during plasma assisted deposition the chucking device including groups of feedthroughs arranged so as to supply a high electrical power density to the first and second strips while minimizing heat-up of the chucking device; and openings extending axially through the first, second and third insulating layers, the openings being large enough to allow lifting pins to pass through the chucking device.

2. The chucking device of claim 1, wherein the heater electrode includes an inner heater electrode comprising a spirally extending strip of electrically conductive material.

3. The chucking device of claim 2, wherein the heater electrode includes an outer heater electrode surrounding the inner heater electrode, the outer heater electrode comprising a spirally extending strip of conductive material.

4. The chucking device of claim 1, wherein the first strip is electrically connected to a first direct current power supply and the second strip is electrically connected to a second direct current power supply, the first and second direct current power supplies being at opposite polarities.

5. The chucking device of claim 1, further comprising a heat sink base, the third insulating layer being located between the heat sink base and the heater electrode.

6. The chucking device of claim 1, further comprising a fourth insulating layer of electrically insulating ceramic material and a metallization layer on the fourth insulating layer, the metallization layer including a plurality of radially extending legs electrically connected to the clamping electrode.

7. A multilayered electrostatic chucking device, comprising:

a first insulating layer of an electrically insulating ceramic material;

a second insulating layer of an electrically insulating ceramic material;

an electrostatic clamping electrode between the first and second insulating layers, the clamping electrode including first and second strips of electrically conductive material;

a third insulating layer of electrically insulating ceramic material; and a heater electrode between the second and third insulating layers; and a plurality of groups of electrically conductive feedthroughs in the second insulating layer, a first group of the feedthroughs being electrically connected to the first strip and a second group of the feedthroughs being electrically connected to the second strip, the feedthroughs being arranged so as to supply a high electrical power density to the first and second strips while minimizing heat-up of the chucking device.

8. A multilayered electrostatic chucking device, comprising a first insulating layer of an electrically insulating ceramic material;

a second insulating layer of electrically insulating ceramic material;

an electrostatic clamping electrode between the first and second insulating layers, the clamping electrode including first and second strips of electrically conductive material;

a first group of electrically conductive feedthroughs extending through the second insulating layer and in electrical contact with the first strip; and a second group of electrically conductive feedthroughs extending through the second insulating layer and in electrical contact with the second strip, the feedthroughs being arranged so as to supply a high electrical power density to the first and second strips while minimizing heat-up of the chucking device.

9. The chucking device of claim 8, wherein the clamping electrode is electrically connected to a direct current power supply and a radio frequency energy supply, the direct current power supply providing the clamping electrode with energy sufficient to electrostatically clamp a substrate on the first insulating layer and the radio frequency energy supply providing the clamping electrode with energy sufficient to provide a substrate clamped on the first insulating layer with an RF bias during plasma assisted deposition.

10. The chucking device of claim 8, wherein the first strip is electrically connected to a first direct current power supply and the second strip is electrically connected to a second direct current power supply, the first and second direct current power supplies being at opposite polarities.

11. The chucking device of claim 8, further comprising a third insulating layer and a heater electrode between the third insulating layer and the second insulating layer, the heater electrode comprising a spirally extending strip of electrically conductive material.

12. The chucking device of claim 11, wherein the heater electrode comprises an inner heater electrode, the chucking device further comprising an outer heater electrode surrounding the inner heater electrode, the second heater electrode comprising a spirally extending strip of conductive material.

13. The chucking device of claim 1, further comprising groups of electrically conductive feedthroughs in the third insulating layer, the groups of the feedthroughs in the third insulating layer being electrically connected to the first strip.

14. The chucking device of claim 13, further comprising a fourth insulating layer of electrically insulating ceramic material and a second metallization layer on the fourth insulating layer, the second metallization layer including a plurality of radially extending legs electrically connected to the first strip.

15. The chucking device of claim 8, further comprising a heat sink base, the second insulating layer being located between the heat sink base and the clamping electrode.

16. The chucking device of claim 8, further comprising openings extending axially through the first and second insulating layers, the openings being large enough to allow lifting pins to pass through the chucking device.

17. A method of making a ceramic electrostatic chuck comprising steps of:
- providing a first metallization layer on a top side of a first insulating layer, the first insulating layer comprising electrically insulating ceramic material in a green state having first and second groups of electrically conductive feedthroughs extending therethrough, the metallization layer comprising an electrostatic clamping electrode pattern of first and second strips of electrically conductive material;
- providing a second metallization layer on a top side of a second insulating layer, the second insulating layer comprising electrically insulating ceramic material in a green state having third groups of electrically conductive feedthroughs extending therethrough, the second metallization layer comprising a power distributing electrode pattern of electrically conductive material;
- assembling the second insulating layer on a bottom side of the first insulating layer; and
- cofiring the first and second insulating layers and forming a sintered body with the first and third groups of feedthroughs in electrical contact with the first strip and the second group of feedthroughs in electrical contact with the second strip, the feedthroughs being arranged so as to supply a high electrical power density to the first and second strips while minimizing heat-up of the chuck.

18. The method of claim 17, further comprising providing a third metallization layer on a top side of a third insulating layer, the third insulating layer comprising electrically insulating ceramic material in a green state, the third metallization layer comprising a second power distribution electrode pattern of electrically conductive material, and assembling the third insulating layer on a bottom side of the second insulating layer prior to the cofiring step.

19. The method of claim 18, further comprising providing a fourth metallization layer on a top side of a fourth insulating layer, the fourth insulating layer comprising electrically insulating ceramic material in a green state, the fourth metallization layer comprising a heater electrode pattern of electrically conductive material, and assembling the fourth insulating layer on a bottom side of the third insulating layer prior to the cofiring step.

20. The method of claim 19, wherein the heater electrode comprises a spirally extending strip of electrically conductive material.

21. The method of claim 20, wherein the heater electrode comprises an inner heater electrode, the chucking device further comprising an outer heater electrode surrounding the inner heater electrode, the second heater electrode comprising a spirally extending strip of conductive material the first and second heater electrodes being powered by independent power sources.

22. The method of claim 17, further comprising attaching a heat sink base to the sintered body.

23. The method of claim 17, further comprising assembling a top insulating layer on the top of the first insulating layer of electrically insulating material in a green state prior to the cofiring step.

24. The method of claim 17, further comprising assembling a top insulating layer on the top of the first insulating layer of electrically insulating material in a green state subsequent to the cofiring step.

25. A method of making a ceramic electrostatic chuck comprising steps of:
- providing a first insulating layer having an electrostatic clamping electrode pattern of first and second strips of electrically conductive material on the top side thereof, the first insulating layer comprising electrically insulating ceramic material in a green state having first and second groups of electrically conductive feedthroughs extending therethrough, the first group of feedthroughs being in electrical contact with the first strip and the second group of feedthroughs being in electrical contact with the second strip;
- providing a first metallization layer on a top side of a second insulating layer, the second insulating layer comprising electrically insulating ceramic material in a green state having third groups of electrically conductive feedthroughs extending therethrough, the first metallization layer comprising a power distribution electrode pattern of electrically conductive material;
- assembling the second insulating layer on a bottom side of the first insulating layer; and
- cofiring the first and second insulating layers and forming a sintered body with the first and third groups of feedthroughs in electrical contact with each other, the feedthroughs being arranged so as to supply a high electrical power density to the first and second strips while minimizing heat-up of the chuck.

26. The method of claim 25, further comprising providing a second metallization layer on a top side of a third insulating layer, the third insulating layer comprising electrically insulating ceramic material in a green state, the third metallization layer comprising a power distribution electrode pattern of electrically conductive material, and assembling the third insulating layer on a bottom side of the second insulating layer prior to the cofiring step.

27. The method of claim 25, further comprising providing a top insulating layer of electrically insulating ceramic material over the clamping electrode.

28. The method of claim 27, further comprising grinding an exposed surface of the top insulating layer to provide a predetermined distance between a top of the clamping electrode and the exposed surface of the top insulating layer.

29. The method of claim 27, wherein the ceramic material of the top insulating layer is in a green state and the step of providing the top insulating layer is performed prior to the cofiring step.

30. The method of claim 25, wherein the step of providing the clamping electrode is performed after the cofiring step.

* * * * *